(12) United States Patent
Tanaka et al.

(10) Patent No.: US 12,087,467 B2
(45) Date of Patent: Sep. 10, 2024

(54) SUPERCONDUCTING WIRE, SUPERCONDUCTING COIL USING SAME, AND MRI

(71) Applicant: HITACHI, LTD., Tokyo (JP)

(72) Inventors: Hideki Tanaka, Tokyo (JP); Takaaki Suzuki, Tokyo (JP); Motomune Kodama, Tokyo (JP); Manabu Aoki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 841 days.

(21) Appl. No.: 17/279,187

(22) PCT Filed: Sep. 17, 2019

(86) PCT No.: PCT/JP2019/036323
§ 371 (c)(1),
(2) Date: Mar. 24, 2021

(87) PCT Pub. No.: WO2020/090259
PCT Pub. Date: May 7, 2020

(65) Prior Publication Data
US 2022/0005631 A1    Jan. 6, 2022

(30) Foreign Application Priority Data
Oct. 31, 2018 (JP) .................... 2018-204676

(51) Int. Cl.
*H01B 12/04* (2006.01)
*G01R 33/34* (2006.01)
(Continued)

(52) U.S. Cl.
CPC ....... *H01B 12/04* (2013.01); *G01R 33/34023* (2013.01); *H01F 6/06* (2013.01); *H10N 60/0856* (2023.02); *H10N 60/202* (2023.02)

(58) Field of Classification Search
CPC ..................................................... H01B 12/04
See application file for complete search history.

(56) References Cited

U.S. PATENT DOCUMENTS 5,531,015 A * 7/1996 Manlief ................ H01F 41/069
505/700
2019/0295746 A1 9/2019 Tanaka et al.

FOREIGN PATENT DOCUMENTS

JP       02-260614 A    10/1990
WO    2017/017715 A1    2/2017

OTHER PUBLICATIONS

Hideki Tanaka, et al., "Tensile and Bending Stress Tolerance on Round MgB2 Wire Made By In Situ PIT Process", IEEE Transactions on Applied Superconductivity, vol. 28, No. 4, Jun. 2018.
(Continued)

*Primary Examiner* — Paul A Wartalowicz
(74) *Attorney, Agent, or Firm* — MATTINGLY & MALUR, PC (57) ABSTRACT

The present invention addresses a problem of providing an MgB2 wire material having a small reversible bending radius, a superconducting coil using the same, and an MRI without lowering a critical current value and a critical current density of the MgB2 wire material to an extreme. To solve the problem, provided are a superconducting wire having a plurality of MgB2 strands and a first base metal, a superconducting coil using the same, and an MRI, the superconducting wire being characterized in that in a cross section orthogonal to a wire longitudinal direction, a center point of an area surrounded by the plurality of MgB2 strands and a center axis of a cross section of the superconducting wire are disposed in separated positions.

17 Claims, 4 Drawing Sheets

(51) Int. Cl.
*H01F 6/06* (2006.01)
*H10N 60/01* (2023.01)
*H10N 60/20* (2023.01)

(56) References Cited

OTHER PUBLICATIONS

HKitaguchi, et al., "Superconducting and mechanical performance and the strain effects of a multifilamentary MgB2/Ni tape", Supercond. Sci. Technol. 18 (2005), p. S284-S289.
International Search Report of PCT/JP2019/036323 dated Nov. 5, 2019.

* cited by examiner

SUPERCONDUCTING WIRE, SUPERCONDUCTING COIL USING SAME, AND MRI

TECHNICAL FIELD

The present invention relates to a superconducting wire, a superconducting coil using the superconducting wire, and an MRI.

BACKGROUND ART

When a strong and stable magnetic field is required for an MRI or the like, a desired magnetic field is obtained by energizing a superconducting coil with a current that is hardly attenuated. When an electromagnet is made of a copper wire, current density per a cross-sectional area of the copper wire is about several $A/mm^2$. However, in a case of a superconducting coil, a strong magnetic field is generated by a coil having a small physique by setting high current density of about several hundred $A/mm^2$. An NbTi wire material, which is a low-temperature-superconducting wire material, is mainly used for a superconducting coil of the related art, but its operational temperature is as low as about 4 K, so cooling with liquid helium is mainly required. Due to the tight supply of helium in recent years, a superconducting wire material which does not require liquid helium and can be used at high temperatures has been developed.

MgB2 superconductor has a high critical temperature of about 39 K and can maintain a superconducting state without cooling to about 4 K, which requires liquid helium. Recent development of a wire material of the MgB2 superconductor has made it possible to manufacture a superconducting coil using an MgB2 wire material.

For example, with respect to a superconducting coil using the MgB2 wire material, JP-A-2017-530462 (PTL 1) discloses "A superconducting wire which includes a strand composed of MgB2 and a first metal which does not react with Mg, wherein a cross section orthogonal to a longitudinal direction of the superconducting wire, a region from a center of the superconducting wire to an installation position of the strand is composed of the strand and the first metal".

CITATION LIST

Patent Literature

PTL 1: JP-A-2017-530462

Non Patent Literature

NPTL 1: IEEE Trans. Appl. Supercond., Vol. 28, No. 4, June 2018, 8400605
NPTL 2: Superbond. Sci. Technol., Vol. 18, No. 12, November 2005, Art no. S284

SUMMARY OF INVENTION

Technical Problem

There are roughly two types of methods for manufacturing a superconducting coil using an MgB2 wire material. One is a method called the wind-and-react method. This is a method in which a non-heat treated MgB2 wire material (strictly speaking, a wire material filled with a mixed powder of magnesium powder and boron powder before heat treatment) is wound into a coil shape and then heat treated.

The other is a method called the react-and-wind method. This is a method of winding a heat treated MgB2 wire material into a coil shape. Here, the heat treated MgB2 wire material has a reversible bending radius, and when the wire is bent with a curvature smaller than a bending radius, superconducting characteristics will deteriorate. As a result, it can be a constraint on design and manufacture of a superconducting coil using an MgB2 wire material.

For example, reversible tensile strain when a tensile load or a bending load is applied to a heat treated MgB2 wire material at room temperature is about 0.2% (NPTL 1). On the other hand, reversible compressive strain of the heat treated MgB2 wire material is about 0.5% (NPTL 2). Therefore, when the heat treated MgB2 wire material is wound to produce a superconducting coil, there is a concern that tension and bending of the wire material may exceed tensile strain allowed for the MgB2 wire material and reduce its superconducting characteristics.

Performance degradation due to bending of the MgB2 wire material occurs when strain applied to an MgB2 filament portion exceeds an allowable value (NPTL 1). The strain applied to the MgB2 filament portion due to the bending of the wire material is proportional to a distance from a neutral axis of bending of the filament, generally a distance between the filament and a center of the MgB2 wire material. Therefore, in order to reduce a reversible bending radius, the MgB2 filament may be arranged only at a center of the wire material, or the entire MgB2 wire material may be thinned. However, in those solutions, an MgB2 filament area is reduced, so that a critical current value and critical current density of the MgB2 wire material are extremely lowered.

From the above, it is required to provide an MgB2 wire material having a small reversible bending radius without extremely lowering the critical current value and the critical current density of the MgB2 wire material.

Solution to Problem

To achieve the object described above, the invention uses a superconducting wire which includes a plurality of MgB2 strands and a first base metal, where a center point of a region surrounded by the plurality of MgB2 strands and a central axis of a superconducting wire cross section are located apart from each other in a cross section orthogonal to a wire longitudinal direction.

Advantageous Effects of Invention

According to the invention, it is possible to provide an MgB2 wire material which can be bent with a bending radius smaller than that of an MgB2 wire material of the related art without extremely lowering a critical current value and critical current density.

DESCRIPTION OF EMBODIMENT

Hereinafter, embodiments of the invention will be described with reference to the drawings.

First Example

Hereinafter, an example of the invention will be described with reference to FIGS. 1 and 2.

A cross section orthogonal to a longitudinal direction of a wire is referred to as a lateral cross section. FIG. 1 illustrates a schematic lateral cross-sectional view of a superconducting wire 100 common to respective examples. A strand 1 mainly composed of MgB2 is contained in a first base metal 2. In FIG. 1, a plurality of strands 1 are arranged so as to draw a circle. A region 3 surrounded by the strands is also composed of the first base metal 2. Taking iron, which is one of the BCC metals, as an example, the cross-sectional view illustrated in FIG. 1 is composed of only Mg, B, iron, and their reactants. In this example, iron will be described as an example, but the first base metal 2 may be a BCC metal and niobium or the like can be taken in addition to iron.

As a method for manufacturing the superconducting wire 100 having this cross-sectional structure, first, a wire having a substantially circular cross-sectional shape surrounded by the strands 1 is manufactured. As a first manufacturing method, a plurality of holes are provided in a columnar iron material and the holes are filled with MgB2, magnesium, boron, or the like, and then if necessary, wire drawing and heat treatment are performed. As a second manufacturing method, the iron pipe is filled with MgB2, magnesium, boron, or the like, and if necessary, a plurality of single-core wires which have been subject to re drawing and heat treatment are bundled together, and then those are filled in an iron pipe, and if necessary, wire drawing and heat treatment are performed, in such a manner that the superconducting wire 100 is manufactured.

Next, a die drawing process and a cassette roll process are performed so that the cross-sectional shape approaches a quadrangle, and a wire having a substantially quadrangular cross-sectional shape surrounded by the strands is manufactured. Using an iron ribbon-shaped wire having a width surrounding the wire having a substantially quadrangular cross-sectional shape, it covers the wire having a substantially quadrangular cross-sectional shape so that a part of the wire is doubled, and then the wire illustrated in FIG. 1 is obtained by performing die drawing processing and cassette roll processing.

Figure 1:
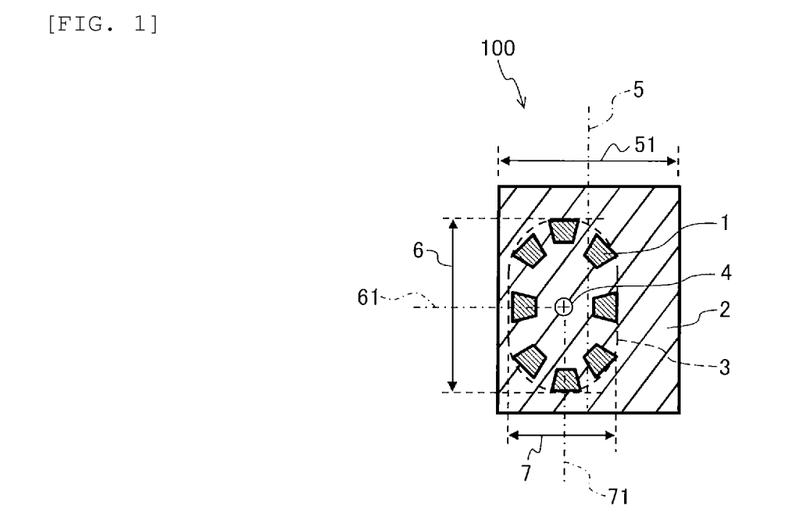
FIG. 1 is a lateral cross-sectional view of an MgB2 wire material according to a first example.
Figure 2:
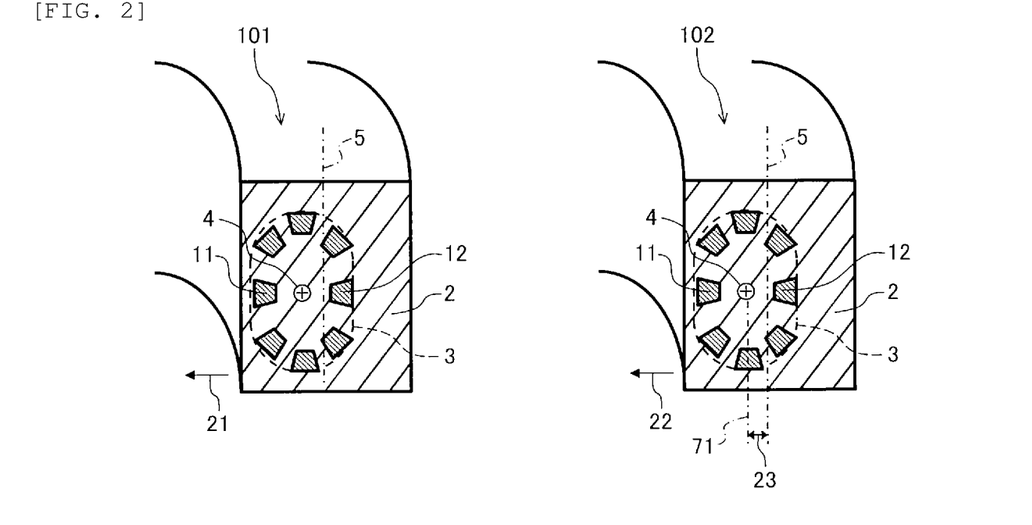
FIG. 2 is a schematic view of the MgB2 wire material during heat treatment and coil winding in the first example.

As illustrated in FIG. 1, in the wire manufactured by the production method described above, a center point 4 of the region 3 surrounded by the strands and a central axis 5 of the wire cross section are separated from each other without intersecting, and it has a substantially similar lateral cross-sectional structure no matter where it is cut. When the cross-sectional shape as illustrated in FIG. 1 is approximately quadrangular, a direction of a long side of the substantially quadrangle is indicated as a height direction and a direction of a short side is indicated as a width direction.

Here, the center point 4 is the intersection of a central axis 61 of a line segment 6 which is the maximum in the height direction and a central axis 71 of a line segment 7 which is the maximum in the width direction in the region 3 surrounded by the strands. The central axis referred to here is a vertical bisector of a line segment.

On the other hand, the central axis 5 is a vertical bisector of a line segment 51 which is the maximum in the width direction in the cross section of the created superconducting wire 100.

Although FIG. 1 illustrates a case where the number of strands 1 is eight, the invention targets the superconducting wire 100 having a plurality of strands 1 and the number of strands 1 is not limited to eight.

For the thermal stability of the superconducting wire 100, a low resistivity material may be required for its cross-sectional configuration. The iron shown in this example can also be used as a low resistance material by sufficiently reducing the impurity concentration. However, when a material having a smaller resistivity such as copper or oxygen-free copper is added, the cross-sectional structure thereof is illustrated in a second example described below.

When heat-treating the superconducting wire 100 shown in the invention and when winding the heat treated superconducting wire 100 to produce the superconducting coil 107, in general, a bending radius during heat treatment is larger than a bending radius when winding after heat treatment, so it is bent so that the center point 4 of the region surrounded by the strands is located inside the bending. FIG. 2 illustrates a schematic diagram thereof. On the contrary, when the bending radius at the time of heat treatment is smaller than the bending radius at the time of winding after the heat treatment, it is bent so that the center point 4 of the region surrounded by the strands is located outside the bending. (Not illustrated)

When the superconducting wire material 100 having a length of several hundred meters to several kilometers is heat treated, it is often wound around a bobbin and heat treated. In this case, it is wound around the bobbin for heat treatment so that the center point 4 of the region surrounded by the strands is located inside the central axis 5 when viewed from the center of the bobbin. The left side view of FIG. 2 is a schematic view illustrating a state in which the superconducting wire 100 before the heat treatment is wound around the bobbin and the bobbin exists in a direction of an arrow 21. In general, since the bending radius during heat treatment is larger than the bending radius when winding after heat treatment, the bending direction illustrated in FIG. 2 is adopted. However, when the magnitude relation of the bending radius is opposite, it is bent so that the center point 4 is located on the outside. When the superconducting wire 100 after the heat treatment is wound to form a superconducting coil 102, the superconducting coil 102 is formed by winding the superconducting wire material 100 so that the bending direction is the same as that at the time of the heat treatment. The right side view of FIG. 2 is a schematic view illustrating a state in which the superconducting wire 100 after the heat treatment is wound as the superconducting coil 102 and a direction of an arrow 22 is the center direction of the winding. In general, since the bending radius during heat treatment is larger than the bending radius when winding after heat treatment, the bending direction illustrated in FIG. 2 is adopted. However, when the magnitude relation of the bending radius is opposite, it is bent so that the center point 4 is located on the outside.

When the superconducting wire material 100 is wound around the bobbin and heat treated, and then it is wound to form the superconducting coil 102, the superconducting wire material 100 once becomes a straight line shape between the bobbin and the coil. Here, by deforming linearly from the heat treated state, tensile strain is applied to the strand located further on an inner side than the central axis 5 of the wire cross section, for example, a strand 11, and compressive strain is applied to the strand outside, for example, a strand 12.

Next, when the superconducting wire material 100 is wound from a linear shape to the shape of the superconducting coil 102, if the bending radius in the shape of the superconducting coil 102 is smaller than the bending radius during heat treatment, at the moment of bending from a straight line shape to a bending radius equal to the bending radius during heat treatment, the applied tensile and compressive strain are canceled. When the bending radius is further reduced to form the superconducting coil 102, compressive strain is applied to a strand located further on an inner side than the central axis 5 of the wire cross section, for example, the strand 11, and tensile strain is applied to the strand outside, for example, the strand 12. By winding in this way, it is possible to minimize the maximum tensile strain applied to the strand 1 group in the process from the heat treatment state to the linear state to the superconducting coil state.

When the bending radius in the shape of the superconducting coil 102 is smaller than the bending radius during heat treatment, the strain applied to the strand 1 group becomes maximum in the state of being wound around in the shape of the superconducting coil 102. When the bending radius in the shape of the superconducting coil 102 is larger than the bending radius during heat treatment, the strain applied to the strand 1 group becomes maximum in the state of changing linearly from the heat treatment state. Hereinafter, a case where the bending radius in the shape of the superconducting coil 102 is smaller than the bending radius during heat treatment, which is a general example, will be described, but the example is not limited.

The maximum compression and tensile strain applied to the strand 1 group is proportional to the radial distance of the superconducting coil between strand 1 and the central axis 5 of the wire cross section. In the super conducting wire 102 after coil winding, the maximum compressive strain is applied to the strand 11 and the maximum tensile strain is applied to the strand 12. Therefore, considering the distance from the central axis 5, the maximum compressive strain applied to the strand 1 group is larger than the maximum tensile strain.

The strand 1 is more resistant to compressive strain than tensile strain. Therefore, by setting the center point 4 away from the central axis 5 on the center side of the coil winding, the cross-sectional shape can take advantage of the strain tolerance of the strand 1. That is, it is possible to provide an MgB2 wire material having a smaller reversible bending radius than a wire material of the related art.

More specifically, assuming that a distance 23 between the central axis 5 and the center point 4 is set as X and the half length of the line segment 7 is set as 1, the ratio of the maximum compressive strain applied to the strand 11 to the maximum strain applied to the strand 12 is represented by (1+X):(1−X).

Here, the reversible tensile strain when a tensile load or a bending load is applied to the heat treated MgB2 wire material at room temperature is about 0.2% (NPTL 1). On the other hand, the reversible compressive strain of the heat treated MgB2 wire material is about 0.5% (NPTL 2). When X is obtained in consideration of the above, it is derived that X is about 0.43.

Therefore, the central axis 5 and the center point 4 are shaped to be separated by about 20% of the length of the line segment 7, for example, a distance of 10% or more and 30% or less in consideration of manufacturing errors and differences in wire characteristics, in such a manner that the cross-sectional shape can maximize the strain tolerance of the strand 1 and it becomes possible to provide the MgB2 wire material having a smaller reversible bending radius.

In many cases, after the superconducting wire 100 is heat treated, the superconducting wire 100 is subject to insulation processing before being wound around in the shape of the superconducting coil 102. A reel-to-reel device is used to continuously insulate the superconducting wire 100. The strain applied to the strand 1 in this process is also within the reversible strain.

In the MgB2 superconducting wire, which has copper in the region 3 surrounded by the strands 1 in the lateral cross section, the heating in a superconducting joint process causes a chemical reaction of copper and this causes copper or copper compounds to precipitate in a location different from where copper is present before heating. Therefore, the mechanical strength is impaired due to the formation of a gap in the region 3 surrounded by the strands 1 and the connection between MgB2s is hindered by precipitation at the connection interface between MgB2s. In the invention, since copper is not contained in the region 3 surrounded by the strands, there is no gap in this region, and thus it is advantageous that the mechanical strength is not impaired.

Figure 3:
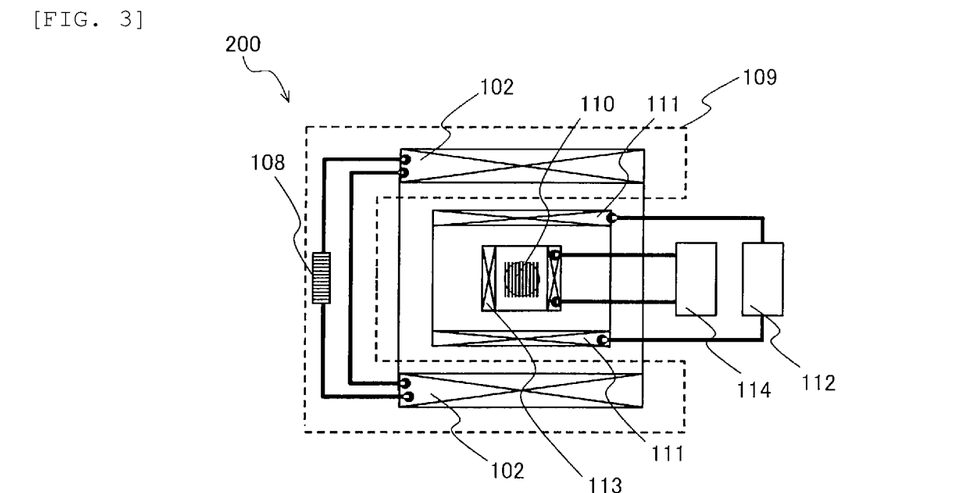
FIG. 3 is a schematic configuration diagram of an MRI using the invention.

FIG. 3 illustrates a schematic configuration of an MRI 200 using the invention. The superconducting coil 102 using the superconducting wire 100 is stored in a refrigerating container 109 together with a persistent current switch 108 and is cooled by the refrigerant or the refrigerator. The persistent current flowing through the superconducting coil 102 and the persistent current switch 108 generates a static magnetic field having high time stability at a position of a measurement target 110. The higher the static magnetic field strength, the higher the nuclear magnetic resonance frequency and the higher the nuclear magnetic resonance signal strength. A gradient coil 111 is supplied with a current which changes with time as needed from an amplifier for gradient field 112 and generates a static magnetic field having a spatial distribution at the position of the measurement target 110. Further, by applying a magnetic field having a nuclear magnetic resonance frequency to a measurement target using a Radio Frequency (RF) antenna 113 and an RF transmitter and receiver 114 and measuring a reaction signal, cross-sectional image diagnosis of the measurement target 110 becomes possible.

By using the shape provided in this example, it is possible to introduce a superconducting coil having a smaller reversible bending radius into an MRI apparatus, and thus it is possible to miniaturize the apparatus.

NMR can also be realized using the same configuration. The configuration of the MRI illustrated in FIG. 3 is an example and does not limit the present invention.

Second Example

Figure 4:
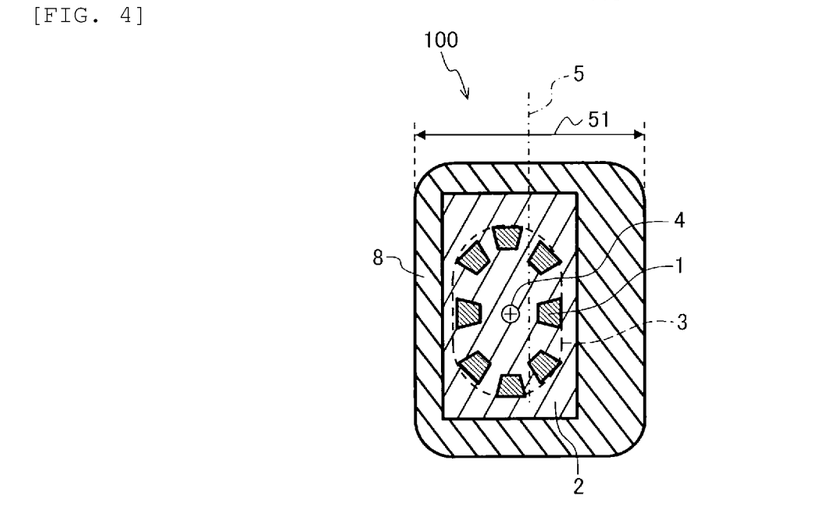
FIG. 4 is a lateral cross-sectional view of an MgB2 wire material according to a second example.

In an example shown below, only the differences from the first example will be described. FIG. 4 illustrates a lateral cross-sectional view of the superconducting wire 100 when a second base metal 8 is arranged in an outermost layer. By using copper or oxygen-free copper as the second base metal 8, it is excellent in that the thermal stability of the superconducting wire 100 can be improved. The superconducting wire 100 of this example uses the same manufacturing method until a wire having a quadrangular cross-sectional shape centered on the center point 4 of the region surrounded by the strands shown in the first example is manufactured.

The superconducting wire 100 of this example can be manufactured by using copper or oxygen-free copper for the ribbon-shaped wire to cover after manufacturing. If it is necessary to increase the distance between the center point 4 in the region surrounded by the strands and the center point 5 in the cross section of the wire material, it is possible to use a partially thickened copper or oxygen-free copper ribbon, in such a manner that the distance between the center point 4 of the region surrounded by the strands and the central axis 5 of the cross section of the wire material can be adjusted. By adjusting the distance between the center point 4 in the region surrounded by the strands and the central axis 5 in the cross section of the wire material, the ratio of the maximum compressive strain to the maximum tensile strain applied to strand 1 when the superconducting coil 102 is formed can be controlled. As a result, it is possible to maximize the performance of the superconducting wire 100.

Third Example

Figure 5:
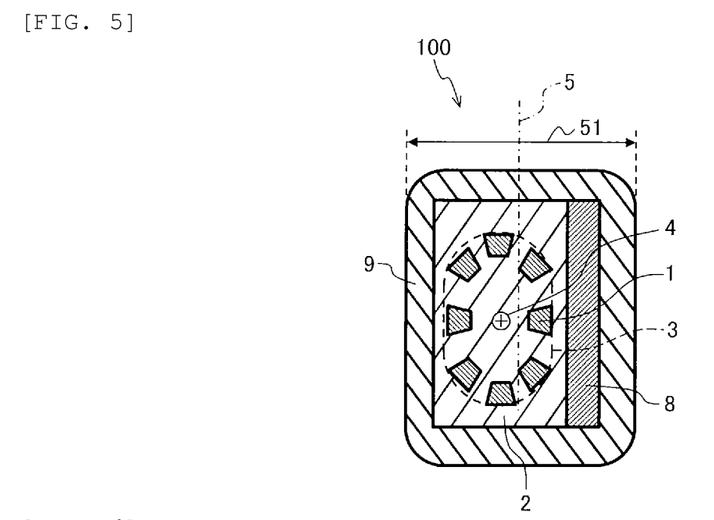
FIG. 5 is a lateral cross-sectional view of an MgB2 wire material according to a third example.

FIG. 5 illustrates a lateral cross-sectional view of the superconducting wire 100 manufactured by covering a first base metal 2 containing strands 1 and a second base metal 8 with a third base metal 9 of an outermost layer. By using copper or oxygen-free copper for the second base metal 8 and using a copper alloy with high mechanical strength for the third base metal 9, similar to the second example, the thermal stability of the superconducting wire 100 can be improved. Further, it is excellent in that the mechanical strength of the wire material can be improved.

The wire of this example uses the same manufacturing method until a wire having a quadrangular cross-sectional shape centered on the center point 4 of a region surrounded by the strands illustrated in the first example is manufactured. It can be manufactured by using a copper alloy for the ribbon-shaped wire for covering after that and simultaneously covering the ribbon-shaped wire of copper or oxygen-free copper.

Fourth Example

Figure 6:
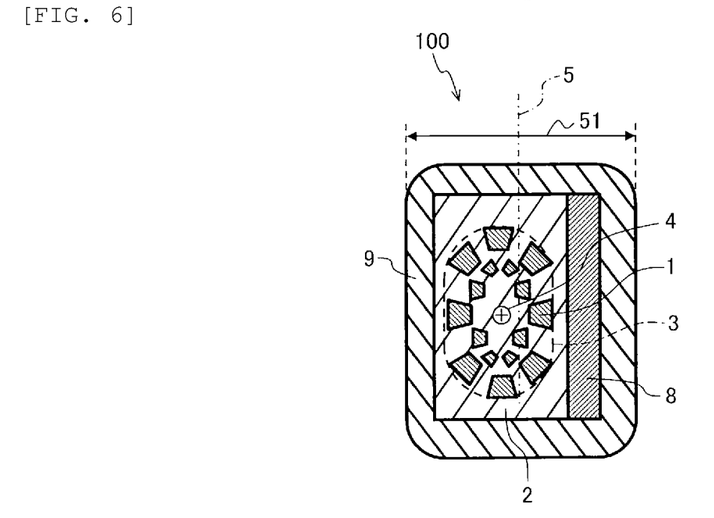
FIG. 6 is a lateral cross-sectional view of an MgB2 wire material according to a fourth example.

FIG. 6 illustrates a lateral cross-sectional view of the superconducting wire 100 when the strands 1 are arranged in a plurality of layers. This example is excellent in that the critical current density per wire cross section can be increased or the strand 1 can be thinned at the same critical current density by increasing the number of strands 1. FIG. 6 illustrates a case where the cross-sectional structure using a second base metal 8 and a third base metal 9 and the arrangement of the strands 1 is two layers, and further the number of the strands 1 is sixteen. However, the invention targets the superconducting wire 100 having a plurality of strands 1 and the arrangement and number of strands 1 are not limited to two layers and sixteen wires.

Fifth Example

Figure 7:
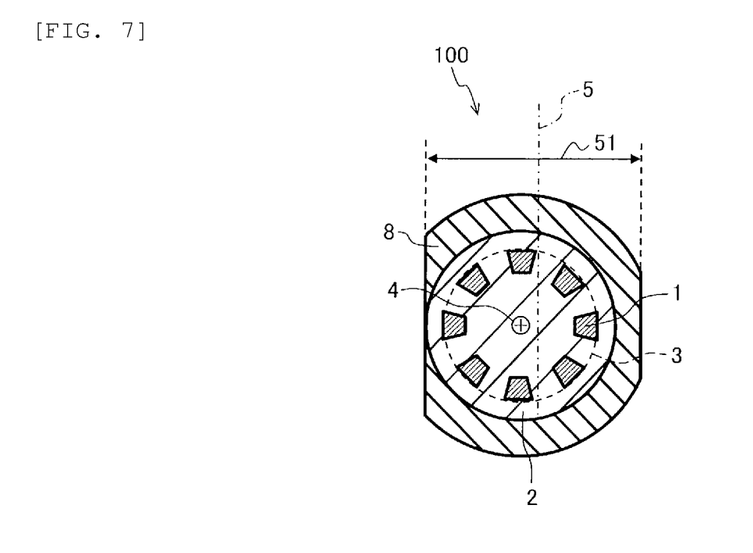
FIG. 7 is a lateral cross-sectional view of an MgB2 wire material according to a fifth example.

FIG. 7 illustrates a lateral cross-sectional view of the superconducting wire 100 when the cross-sectional shape of the wire is a shape obtained by removing a part of a circle. This example is excellent in that it is not necessary to prepare a wire having a rectangular cross section or cover it with a ribbon-shaped wire in the wire manufacturing process, and thus processing process can be simplified. When manufacturing a wire having a circular cross-sectional shape centered on the center point 4 of the region surrounded by the strands 1 illustrated in the first example, the superconducting wire 100 of this example can be manufactured by arranging a metal pipe made of a second base metal 8 in an outermost layer, wire-drawing, and then chemically or mechanically etching two surfaces.

The invention is not limited to the examples described above and includes various modifications. For example, the examples described above are described in detail in order to explain the invention in an easy-to-understand manner and are not necessarily limited to those having all the described configurations. Further, it is possible to replace a part of the configuration of one example with the configuration of another example and it is also possible to add the configuration of one embodiment to the configuration of another embodiment. Further, it is possible to add, delete, or replace a part of the configuration of each example with another configuration.

REFERENCE SIGNS LIST

1: strand (MgB2 strand)
2: first base metal
3: region surrounded by strands
4: center point of region surrounded by strands
5: central axis of cross section of superconducting wire
8: second base metal
9: third base metal
100: superconducting wire
101: superconducting wire during heat treatment
102: superconducting wire after coil winding
108: persistent current switch
109: refrigerating container
110: measurement target
111: gradient coil
112: amplifier for gradient field
113: RF antenna
114: RF transmitter and receiver
200: MRI

The invention claimed is:

1. A superconducting coil comprising:
a superconducting wire which includes a plurality of MgB2 strands and a first base metal, wherein
a center point of a region surrounded by the plurality of MgB2 strands and a central axis of a superconducting wire cross section are located apart from each other in a cross section orthogonal to a wire longitudinal direction,
when a bending radius during a heat treatment of the superconducting wire is larger than a bending radius of the superconducting coil, the superconducting wire is bent in the superconducting coil so that the center point of the region surrounded by the plurality of MgB2 strands is located inside the bending, and
when a bending radius during the heat treatment of the superconducting wire is smaller than the bending radius of the superconducting coil, the superconducting wire is bent in the superconducting coil so that the center point of the region surrounded by the plurality of MgB2 strands is located outside the bending.

2. The superconducting wire according to claim 1, wherein
in a width direction of the superconducting wire which is a short side direction of the superconducting wire cross section which is a substantially quadrangle, a distance between the center point and the central axis is 10% or more and 30% or less of a maximum length in the width direction of the region surrounded by the plurality of MgB2 strands.

3. The superconducting coil according to claim 1, wherein in a width direction of the superconducting wire which is a short side direction of the superconducting wire cross section which is a substantially quadrangle, a distance between the center point and the central axis is a predetermined distance calculated based on a maximum length in the width direction of the region surrounded by the plurality of MgB2 strands and reversible compressive strain and reversible tensile strain of the MgB2 strand.

4. The superconducting coil according to claim 2, wherein the central axis of the superconducting wire is a central axis of a line segment having a maximum length in the width direction of the superconducting wire cross section.

5. The superconducting coil according to claim 2, wherein the center point of the superconducting wire is an intersection of a vertical bisector of a line segment having a maximum length in a height direction, which is a long side direction of the superconducting wire cross section which is a substantially quadrangle, and a vertical bisector of a line segment having a maximum length in the width direction in the region surrounded by the plurality of MgB2 strands.

6. The superconducting coil according to claim 1, wherein the first base metal of the superconducting wire is a body centered cubic (BCC) metal.

7. The superconducting coil according to claim 1, wherein a second base metal of the superconducting wire is provided outside the first base metal in the cross section.

8. The superconducting coil according to claim 7, wherein the second base metal of the superconducting wire is copper or oxygen-free copper.

9. The superconducting coil according to claim 7, wherein a third base metal of the superconducting wire which surrounds the first base metal and the second base metal from the outside is provided in the cross section.

10. The superconducting coil according to claim 9, wherein the third base metal of the superconducting wire is a copper alloy.

11. An MRI comprising the superconducting coil according to claim 1.

12. The superconducting coil according to claim 3, wherein the central axis of the superconducting wire is a central axis of a line segment having a maximum length in the width direction of the superconducting wire cross section.

13. The superconducting coil according to claim 3, wherein the center point of the superconducting wire is an intersection of a vertical bisector of a line segment having a maximum length in a height direction, which is a long side direction of the superconducting wire cross section which is a substantially quadrangle, and a vertical bisector of a line segment having a maximum length in the width direction in the region surrounded by the plurality of MgB2 strands.

14. The superconducting coil according to claim 2, wherein the first base metal of the superconducting wire is a body centered cubic (BCC) metal.

15. The superconducting coil according to claim 3, wherein the first base metal of the superconducting wire is a body centered cubic (BCC) metal.

16. The superconducting coil according to claim 2, wherein a second base metal of the superconducting wire is provided outside the first base metal in the cross section.

17. The superconducting coil according to claim 3, wherein a second base metal of the superconducting wire is provided outside the first base metal in the cross section.

* * * * *